(12) United States Patent
Wojcik et al.

(10) Patent No.: US 11,070,025 B2
(45) Date of Patent: Jul. 20, 2021

(54) SEMICONDUCTOR RADIATION SOURCE

(71) Applicant: OSRAM Opto Semiconductors GmbH, Regensburg (DE)

(72) Inventors: Andreas Wojcik, Regensburg (DE); Hubert Halbritter, Dietfurt (DE); Josip Maric, Sinzing (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/491,184

(22) PCT Filed: Mar. 20, 2018

(86) PCT No.: PCT/EP2018/056976
§ 371 (c)(1),
(2) Date: Sep. 5, 2019

(87) PCT Pub. No.: WO2018/188910
PCT Pub. Date: Oct. 18, 2018

(65) Prior Publication Data
US 2020/0036156 A1 Jan. 30, 2020

(30) Foreign Application Priority Data

Apr. 13, 2017 (DE) ..................... 10 2017 108 050.3

(51) Int. Cl.
*H01S 3/00* (2006.01)
*H01S 5/026* (2006.01)
(Continued)

(52) U.S. Cl.
CPC ............ *H01S 5/0261* (2013.01); *H01S 5/026* (2013.01); *H01S 5/0236* (2021.01);
(Continued)

(58) Field of Classification Search
CPC .... H01S 5/0261; H01S 5/02276; H01S 5/042; H01S 5/026; H01S 5/02272;
(Continued)

(56) References Cited

U.S. PATENT DOCUMENTS 5,977,565 A 11/1999 Ishikawa et al.
2002/0141465 A1* 10/2002 Yamada .............. H01S 5/02325
372/36

(Continued)

FOREIGN PATENT DOCUMENTS

DE 20 2006 005 148 U1 9/2007
DE 10 2017 118 349 A1 2/2018

*Primary Examiner* — Kinam Park
(74) *Attorney, Agent, or Firm* — DLA Piper LLP (US)

(57) ABSTRACT

A semiconductor radiation source includes at least one semiconductor chip that generates radiation; a controller with one or more switching elements configured for pulsed operation of the semiconductor chip; and at least one capacitor body, wherein the semiconductor chip directly electrically connects in a planar manner to the capacitor body, the controller electrically connects to a side of the semiconductor chip opposite the capacitor body, and the controller, the capacitor body and the semiconductor chip are stacked on top of each other so that the capacitor body is located between the control unit and the semiconductor chip.

16 Claims, 6 Drawing Sheets

(51) Int. Cl.
*H01S 5/042* (2006.01)
*H01S 5/068* (2006.01)
*H01S 5/02345* (2021.01)
*H01S 5/0236* (2021.01)
*H01S 5/062* (2006.01)
*H01S 5/0237* (2021.01)

(52) U.S. Cl.
CPC ........ *H01S 5/0237* (2021.01); *H01S 5/02345* (2021.01); *H01S 5/042* (2013.01); *H01S 5/0428* (2013.01); *H01S 5/06216* (2013.01); *H01S 5/06825* (2013.01)

(58) Field of Classification Search
CPC .. H01S 5/0226; H01S 5/0428; H01S 5/06216; H01S 5/0237; H01S 5/0236
See application file for complete search history.

(56) References Cited

U.S. PATENT DOCUMENTS

| | | | |
|---|---|---|---|
| 2003/0086635 A1* | 5/2003 | Bylsma | G02B 6/12004 |
| | | | 385/14 |
| 2004/0247005 A1* | 12/2004 | Schrodinger | H01S 5/0261 |
| | | | 372/38.1 |
| 2005/0023575 A1* | 2/2005 | Wu | H01L 27/0288 |
| | | | 257/256 |
| 2005/0253158 A1* | 11/2005 | Yasukawa | C09K 11/7735 |
| | | | 257/98 |
| 2006/0045437 A1 | 3/2006 | Tatum et al. | |
| 2015/0092805 A1* | 4/2015 | Mitsuyama | H01S 5/06825 |
| | | | 372/38.09 |
| 2016/0129513 A1* | 5/2016 | Oka | B23K 1/0016 |
| | | | 372/38.07 |
| 2018/0045882 A1 | 2/2018 | Chojnacki et al. | |
| 2018/0278011 A1* | 9/2018 | Galvano | H01S 5/0231 |

* cited by examiner

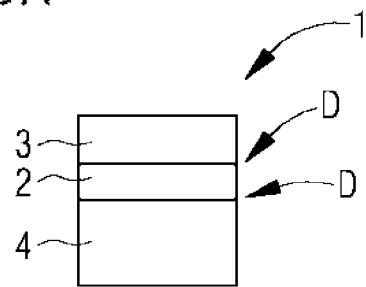
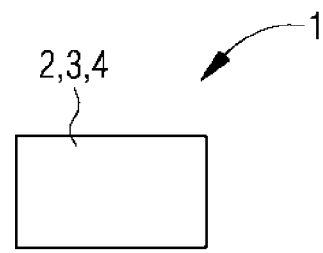
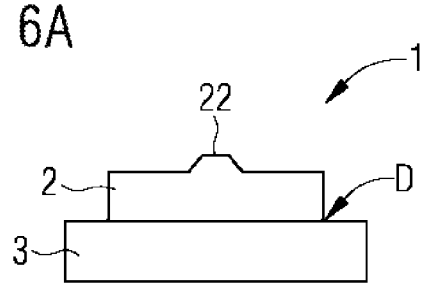
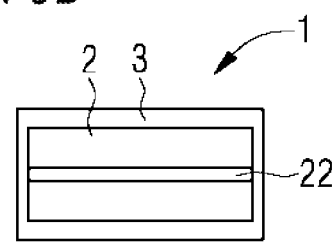
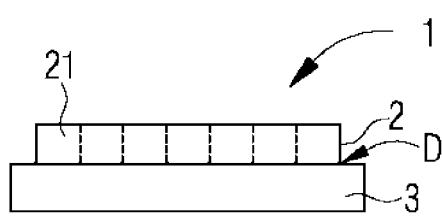
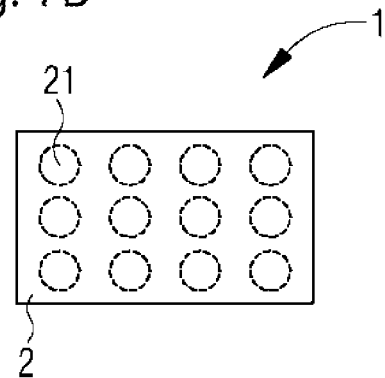

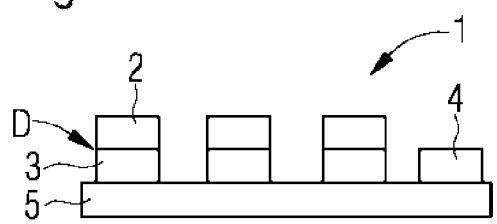
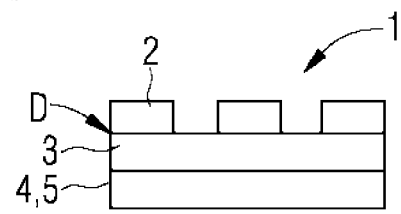
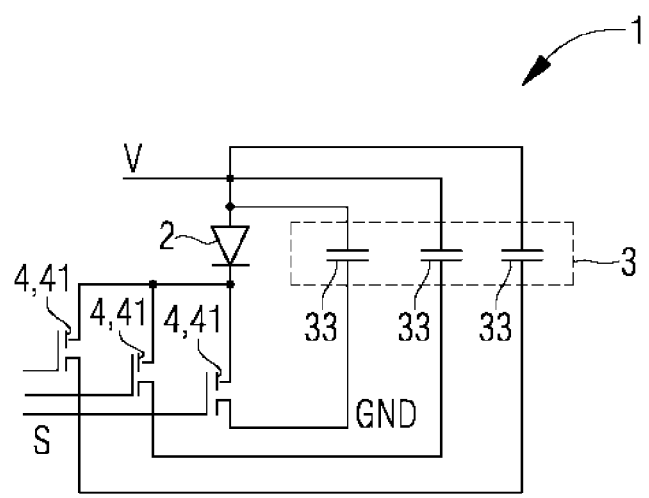

SEMICONDUCTOR RADIATION SOURCE

TECHNICAL FIELD

This disclosure relates to a semiconductor radiation source.

BACKGROUND

There is a need to provide a semiconductor radiation source that can be operated in a pulsed manner with high currents.

SUMMARY

We provide a semiconductor radiation source including at least one semiconductor chip that generates radiation, a controller with one or more switching elements configured for pulsed operation of the semiconductor chip, and at least one capacitor body, wherein the semiconductor chip directly electrically connects in a planar manner to the capacitor body, the controller electrically connects to a side of the semiconductor chip opposite the capacitor body, and the controller, the capacitor body and the semiconductor chip are stacked on top of each other so that the capacitor body is located between the controller and the semiconductor chip.

We also provide a semiconductor radiation source including at least one semiconductor chip that generates radiation, and at least one capacitor body, wherein the semiconductor chip and the capacitor body are stacked on top of each other, and the semiconductor chip directly electrically connects in a planar manner to the capacitor body.

BRIEF DESCRIPTION OF THE DRAWINGS

FIGS. 1A, 2A, 3, 4A, 5A, 6A, 7A, 8A and 8B show schematic sectional views of examples of semiconductor radiation sources.

FIGS. 5B, 6B and 7B show schematic top views of examples of semiconductor radiation sources.

FIGS. 1B, 2B, 4B and 9 show schematic circuit diagrams of examples of semiconductor radiation sources.

Figure 1A:
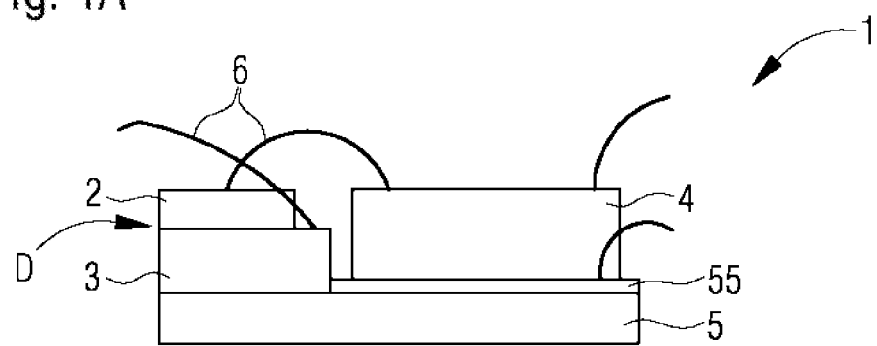

LIST OF REFERENCE SIGNS 1 semiconductor radiation source
2 semiconductor chip
21 emitter unit
22 ridge waveguide
3 capacitor body
31 electrical contact surface of the capacitor body
33 individual capacitor
4 control unit
41 switching element
5 carrier
55 planar conductor track
6 bond wire
10 modification
D direct, planar electrical connection line
GND ground contact
S signal line
V supply voltage
a, b, L, T, W dimensions of the capacitor body

DETAILED DESCRIPTION

Our semiconductor radiation source comprises one or more semiconductor chips. The at least one semiconductor chip generates radiation. This means that the radiation emitted during operation of the semiconductor radiation source is generated by the at least one semiconductor chip. The semiconductor chip is preferably a semiconductor laser chip such as an edge-emitting semiconductor laser or a surface-emitting semiconductor laser, for example, a surface emitting laser with a vertical resonator structure, VCSEL, for short. The semiconductor chip can also be a superluminescent diode.

The semiconductor chip may be configured to generate near ultraviolet radiation, visible light or near infrared radiation. A wavelength of maximum intensity of the radiation generated by the semiconductor chip lies, for example, at least 360 nm or 400 nm or 700 nm and/or at most 1080 nm or 960 nm or 860 nm or 485 nm. It is possible for radiation to be emitted from a plurality of different spectral regions. For example, a plurality of semiconductor chips with different wavelengths of maximum intensity can be combined with one another in the semiconductor radiation source. Alternatively, only one certain wavelength is generated as intended.

The semiconductor radiation source may comprise one or more capacitor bodies. The at least one semiconductor chip may be electrically supplied with current via the at least one capacitor body, in particular in pulsed operation. This means that the capacitor body electrically operates the semiconductor chip.

The semiconductor chip and the capacitor body may be stacked on top of each other. If a plurality of semiconductor chips and/or a plurality of capacitor bodies are present, a one-to-one assignment between the stacked semiconductor chips and the capacitor bodies is particularly preferably present so that only one semiconductor chip and one capacitor body are stacked on top of each other. Preferably, the semiconductor chip or the semiconductor chips lies/lie completely within a base surface of the capacitor body, seen in plan view.

The semiconductor chip and the capacitor body may electrically connect to one another in a planar manner. The electrical connection between the semiconductor chip and the capacitor body is particularly preferably a direct electrical connection without intermediate components. This means in particular that only a planar electrical connection means such as a solder or an electrically conductive adhesive is located between the semiconductor chip and the capacitor body. The electrical connection between the semiconductor body and the capacitor body is particularly preferably bond wire-free.

The semiconductor radiation source may comprise at least one semiconductor chip that generates radiation and at least one capacitor body. The semiconductor chip and the associated capacitor body may be stacked on top of each other. Furthermore, the semiconductor chip may connect in a planar manner and preferably electrically directly to the capacitor body.

A problem when switching high currents in a short time is a reduction of inductances, for example, in the current path between a capacitor, a laser and a switching element such as a field effect transistor. With the indicated semiconductor radiation source, the inductance can be reduced so that small pulse rise times and high switching currents are made possible.

Alternative possibilities to reduce an inductance lie in the closest possible placement of discrete individual components of the semiconductor radiation source to one another to minimize the length of electrical supply lines. An inductance compensation can be effected in part by switching a short-circuit current to a part of the circuit. In this example, however, the inductance is compensated for at the expense of the electrical power.

In the semiconductor radiation source described here, capacitor bodies are used, in particular in the form of silicon chips that on at least one side have, for example, a metal coating, e.g., of gold so that the capacitor body can serve as a dual component. On the one hand, the capacitor body serves as a mounting platform, also referred to as a submount, for the semiconductor chip. On the other hand, the capacitor body serves as an energy store for the short laser pulses. This combination means that practically any inductance otherwise resulting from bond wires or electrical conductor tracks between the semiconductor chip and the capacitor body is dispensed with. The semiconductor chip is preferably a thin-film laser chip from which a growth substrate has been removed, wherein the capacitor body is preferably used as a carrier substrate for a semiconductor layer sequence of the semiconductor chip.

With the semiconductor radiation source, a low total inductance can be achieved whereby higher current intensities and/or shorter radiation pulses can be achieved, combined with an increased efficiency. A small component size can also be realized. The semiconductor radiation source can be used in the automobile industry, for example, in headlights. Since standardized components can be used for the capacitor body, the costs of the semiconductor radiation source can be reduced. Furthermore, the semiconductor radiation source is preferably highly temperature-compatible, for example, in headlight applications. This can mean that the semiconductor radiation source can be operated at operating temperatures in particular of at least 180° C. or 150° C. or 120° C.

The semiconductor chip may be a semiconductor laser chip. For example, a substrate-less semiconductor laser chip, also referred to as thin-film laser chip, is used. In this way, the semiconductor chip is preferably free of a growth substrate of a semiconductor layer sequence, in which there is an active zone that generates the radiation. The capacitor body can act as a mechanical support for the semiconductor chip so that the semiconductor chip is not mechanically self-supporting without the capacitor body.

The capacitor body may have a larger base area than the semiconductor chip. As an alternative, the capacitor chip and the semiconductor chip can have the same base area. The same basic area means in particular that the semiconductor chip and the capacitor chip are congruent when viewed from the top. Other than this, the semiconductor chip and the capacitor body may also not be congruent so that in particular the capacitor body projects beyond the semiconductor chip on one or more sides when viewed from the top. The semiconductor chip is preferably located completely on the capacitor body so that the semiconductor chip does not project laterally beyond the capacitor body.

The size of an electrical contact area between the semiconductor chip and the capacitor body may amount to at least 35% or 50% or 70% or 90% of the base area of the capacitor body. In other words, between the capacitor body and the semiconductor chip electrical contact may be made over the whole area or almost over the whole area.

The electrical contact area between the semiconductor chip and the capacitor body may have a size of at least 60% or 80% or 95% of a base area of the semiconductor chip. The base area is in particular a surface area of the semiconductor chip when viewed as a plan view. This means that the semiconductor chip can be electrically contacted over the entire or almost over the entire base area. In particular, the base area is a main side, that is, a largest side of the semiconductor chip. For example, the semiconductor chip is of cuboid or approximately cuboid shape.

The semiconductor chip and the capacitor may body have the same lateral dimensions as seen in plan view with a tolerance of at most 5% or 10% or 20% along main directions or along each direction. That is, the semiconductor chip and the capacitor body can have the same or approximately the same size when seen in plan view.

A main emission direction of the semiconductor chip may be aligned parallel to the base area of the semiconductor chip and/or to the base surface of the capacitor body and/or to the electrical contact area between the semiconductor chip and the capacitor body. Alternatively, the main emission direction is oriented perpendicular to the base area and/or to the base surface and/or to the electrical contact area. The terms "perpendicular" and "parallel" refer to angles of 90° and 0° relative to one another, in particular with a tolerance of at most 5° or 10° or 15°.

The semiconductor radiation source may comprise one or more control units. The at least one control unit may comprise a switching element or a plurality of switching elements for pulsed operation of the semiconductor chip. The switching elements may be field effect transistors, for example. In addition to the at least one switching element, the control unit can have an integrated circuit, in particular an application-specific integrated circuit, ASIC for short. The control unit can also include a memory unit and/or an identification unit. If a plurality of semiconductor chips or a plurality of emitter regions are provided to generate, in particular, laser radiation, a separate switching element or several separate switching elements can be associated with each semiconductor chip and/or each emitter unit.

The control unit may electrically connect to a side of the semiconductor chip opposite the capacitor body. This connection can be made by one or more conductor tracks or by one or more bond wires. This means that a planar electrical connection is not necessarily present between the semiconductor chip and the control unit.

The control unit and the capacitor body may be arranged next to each other on a common carrier. In this example, the control unit and the capacitor body preferably do not overlap one another as seen in plan view.

The control unit, the capacitor and the semiconductor chip may be stacked on top of each other. These three components can be stacked directly on top of each other so that only connecting means such as solders or adhesives are located between these components.

The capacitor body may be located between the control unit and the semiconductor chip. Alternatively, the semiconductor chip can be located between the control unit and the capacitor body. The components mentioned can each electrically connect directly to one another in a planar manner.

The semiconductor chip may be a ridge waveguide laser. The semiconductor chip then comprises a ridge waveguide.

The ridge waveguide may be located on a side of the semiconductor chip facing away from the capacitor body. A semiconductor layer sequence can thus extend continuously across the semiconductor chip between the ridge waveguide and the capacitor body. This allows the semiconductor layer sequence to be efficiently supplied with current directly via the capacitor on this side of the semiconductor chip. The ridge waveguide is located, for example, in a p-conducting side of the semiconductor chip so that an n-conducting side of the semiconductor chip can face the capacitor body and is optionally directly electrically connected to the capacitor body.

The capacitor body may be a chip. In particular, the capacitor body may be a monolithic body that cannot be divided into subcomponents as intended. In particular, the capacitor body is based on silicon.

The capacitor body may be composed of a plurality of individual capacitors electrically connected in parallel. The individual capacitors can be produced of monolithically integrated circuits in a chip, for instance on the basis of silicon. It is possible for each of the individual capacitors to have a separate electrical connection to external surfaces of the capacitor body. Alternatively, electrical lines to the individual capacitors can be combined on outer surfaces of the capacitor body. If a plurality of semiconductor chips is provided for generating radiation, each semiconductor chip or each emitter region can be assigned to one of the individual capacitors.

The direct, planar electrical connection line or connection between the semiconductor chip and the capacitor body and/or between the semiconductor chip and the control unit and/or between the control unit and the capacitor body may have only a negligible inductivity. For example, the inductance of the connection line or of the electrical connection is at most 100 pH or 50 pH or 10 pH. Thus, an inductivity of the connecting line or the electrical connection is significantly smaller than in a bond wire.

The capacitor body and/or the individual capacitors may have a capacitance of at least 10 nF or 20 nF or 50 nF. This means that the capacitor body has a comparatively large capacitance.

The semiconductor radiation source can be surface-mounted. This means that electrical connection surfaces for external electrical contacting of the semiconductor radiation source are preferably located in a common plane. Such electrical connection surfaces are attached, in particular, to the capacitor body or to the control unit or to a carrier of the semiconductor radiation source.

A total thickness of the capacitor body together with the semiconductor chip may be at least 0.1 mm or 0.2 mm. Alternatively or additionally, this total thickness is at most 1 mm or 0.5 mm. Alternatively or additionally, mean lateral dimensions of the capacitor body and/or of the semiconductor chip, that is in particular the mean edge lengths thereof seen in plan view, are at least 0.2 mm or 0.4 mm and/or at most 2 mm or 1 mm or 0.6 mm. It is possible that the capacitor body has a greater thickness than the semiconductor chip. For example, the thickness of the capacitor body exceeds that of the semiconductor chip by at least one factor of 2 or 5.

The semiconductor radiation source may comprise a plurality of the semiconductor chips. A single semiconductor chip is alternatively provided that can be divided into several emitter regions that can be controlled electrically together or independently of each other. The semiconductor chips or the emitter regions are preferably arranged two-dimensionally in a field as seen in plan view. The arrangement can be based on a rectangular or hexagonal pattern.

The semiconductor chips and/or emitter regions may be arranged together on a single capacitor. Alternatively, groups of semiconductor chips and/or emitter units may each be mounted on a single capacitor body. It is also possible for the semiconductor chips to be mounted in a distributed manner on a plurality of capacitor bodies. One capacitor body can be provided per semiconductor chip and vice versa.

The semiconductor radiation source may be configured to produce laser pulses or radiation pulses with a small mean pulse duration. For example, the pulse duration is at least 0.2 ns or 0.5 ns and/or at most 5 ns or 2 ns.

Especially in transit time-dependent applications, so-called TOF applications or time of flight-applications, ever shorter light pulses are required, even in sub-nanoseconds range. In conventional discrete structures with bond wire contacting, such switching times are not to realize or are to realize only with difficulty due to relatively high inductances, for example, correlated with conductor tracks on printed circuit boards or with bond wires. Therefore, the semiconductor radiation source described here is particularly suitable for applications of this type.

In the following, a semiconductor radiation source described here is explained in more detail with reference to the drawing by examples. The same reference signs indicate the same elements in the individual figures. However, there are no references to scale shown, rather individual elements may be illustrated exaggeratedly large for better understanding.

Figure 1B:
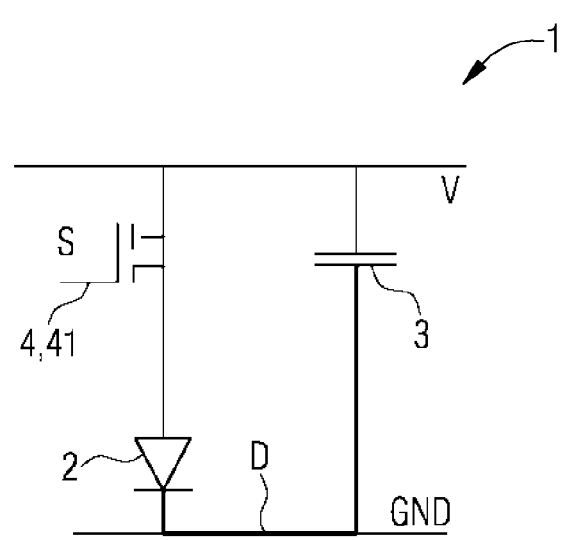

FIGS. 1A and 1B illustrate an example of a semiconductor radiation source 1. For example, the semiconductor radiation source 1 emits near infrared radiation.

The semiconductor radiation source 1 comprises a semiconductor chip 2. For example, the semiconductor chip 2 is an edge-emitting laser. The semiconductor radiation source 1 further contains a control unit 4 and a capacitor body 3. The semiconductor chip 2, the capacitor body 3 and the control unit 4 are mounted on a common carrier 5. The carrier 5 represents the component carrying and mechanically supporting the semiconductor radiation source 1.

The semiconductor chip 2 that generates radiation and the capacitor body 3 are arranged on the carrier 5 and stacked one on top of the other. The control unit 4 is located laterally next to the stack. Via a planar conductor track 55 or a continuous electrical contact surface, the capacitor body 3 and the control unit 4 electrically connect to each other. The capacitor body 3 and the semiconductor chip 2 connect to each other via a direct, planar electrical connection D as shown in FIG. 1B printed as a bold line. Further electrical connections can be realized by bond wires 6.

The capacitor body 3 and the semiconductor chip 2 connect to a supply voltage V and an ground line GND. Further, a switching element 41 such as a field effect transistor of the control unit 4 connects to a signal line S. The control unit 4 is composed, for example, of the at least one switching element 41 and an application-specific integrated circuit.

On account of the flat electrical connection D, the semiconductor chip 2 and the capacitor body 3 electrically connect to one another virtually without inductance. This allows rapid pulse rise times and high currents to be achieved for operation of the semiconductor chip 2. The current intensity is, for example, between 5 A and 35 A. For applications in the automotive field, in particular LIDAR (LIght Detection And Ranging), the current intensities are typically 20 A to 35 A, for example, at approximately 30 A. In other time of flight-applications the current intensities are typically 5 A to 15 A, for example, about 10 A.

Deviating from the illustration in FIG. 1A, it is possible that the semiconductor chip 2 and the capacitor body 3 are accommodated in a common housing, not shown, also referred to as a package. As an alternative to the bonding wires 6, electrical conductor tracks can be used, as also in all examples. Such conductor tracks are guided, for example, on lateral surfaces of the respective components or along such lateral surfaces.

Figure 2A:
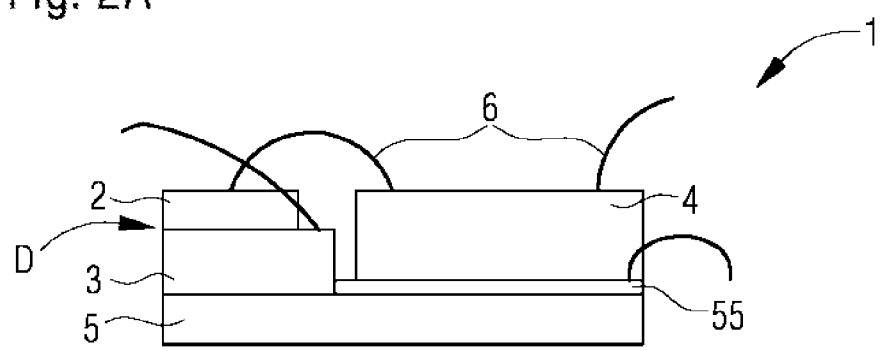
Figure 2B:
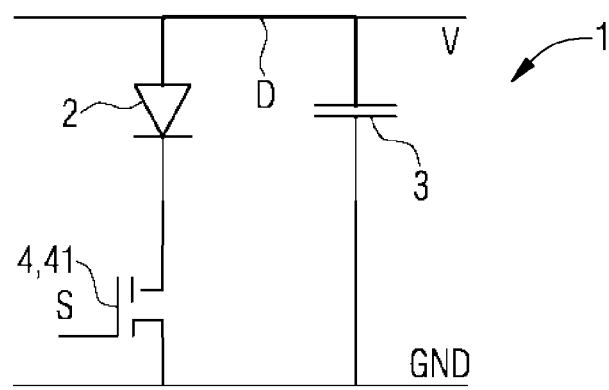

In the examples of FIGS. 1A and 1B, an anode-side contact of the semiconductor chip is located on a side facing away from the carrier 5. This side facing away from the carrier 5 electrically connects to the control unit 4 via one or more bond wires 6 or via at least one electrical conductor track. Contrary to that, according to FIGS. 2A and 2B, the polarity is reversed so that the anode side of the semiconductor chip 2 faces the carrier 5. The example of FIGS. 2A and 2B is otherwise identical to that of FIGS. 1A and 1B.

Figure 3:
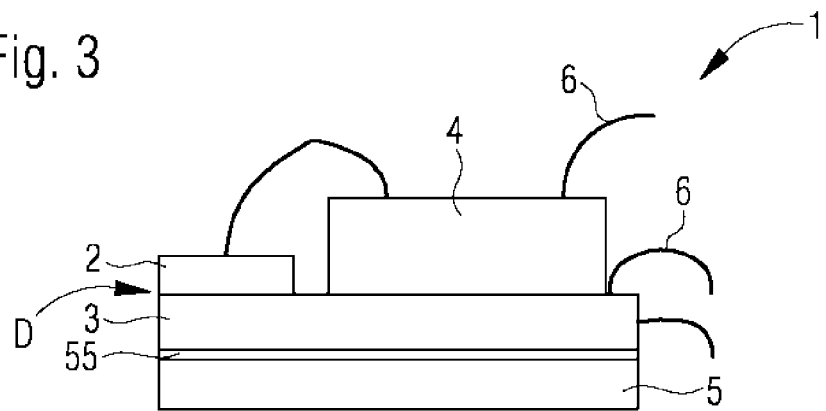

In the example of FIG. 3, both the semiconductor chip 2 and the control unit 4 are mounted on the common capacitor body 3. The capacitor body 3 can thus be used as a mounting platform for the semiconductor chip 2 and the control unit 4. The carrier 5 is thus optional. An anode side of the semiconductor chip 2 can face the capacitor body 3 or can also be turned away from the latter. This means that the electrical connections according to FIG. 1B or according to FIG. 2B can be present in FIG. 3.

Figure 4A:
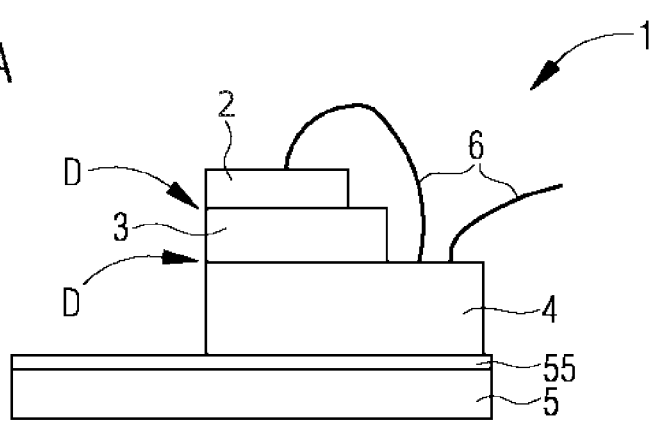
Figure 4B:
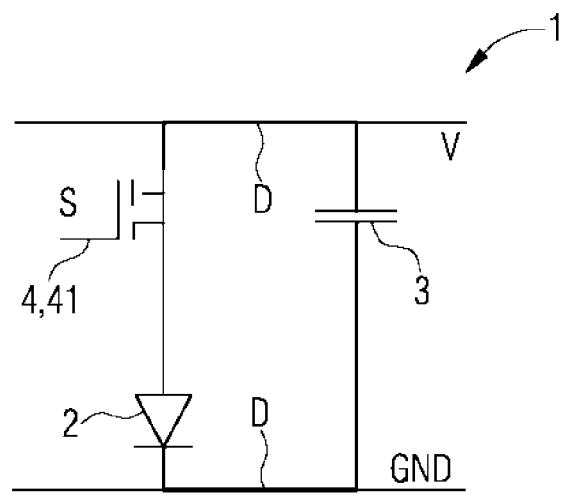

The example of FIGS. 4A and 4B illustrates that the control unit 4 as well as the capacitor body 3 and the semiconductor chip 2 are stacked one on top of the other in the order provided. Hence, flat, direct electrical connection lines D are present on both sides of the capacitor body 3. Other electrical connections are formed by the bond wires 6 or alternatively by metallizations or conductor tracks, in particular along lateral surfaces.

Deviating from FIG. 4A, the control unit 4 can be used as a mounting platform so that the carrier 5 can then be dispensed with.

The associated electrical wiring is symbolized in FIG. 4B. On both sides of the capacitor body 3, the electrical connection lines D are be virtually inductance-free. The electrical interconnection of FIG. 4B corresponds to the interconnection shown in FIG. 1B. Alternatively, the electrical wiring can be made as illustrated in connection with FIG. 2B.

FIG. 5A again shows a stack arrangement of the control unit 4, the semiconductor chip 2 and the capacitor body 3. The semiconductor chip 2 is located directly between the capacitor body 3 and the control unit 4 and connects to the latter via the planar electrical connections D. When viewed from the top, the semiconductor chip 2, the capacitor body 3 and the control unit 4 can be arranged congruently.

In the example of FIGS. 6A and 6B, the semiconductor chip 2 is a ridge waveguide semiconductor laser with a ridge waveguide 22. The ridge waveguide 22 is located on a side of the semiconductor chip 2 facing away from the capacitor body 3. It is possible that the capacitor body 3 acts as a support for the semiconductor chip 2.

As seen in the top view, it is optionally possible for the capacitor body 3 to surround the semiconductor chip 2 all the way around in a narrow strip. The semiconductor chip 2 thus lies completely on the capacitor body 3. A main emission direction of the semiconductor chip 2 is oriented along the ridge waveguide 22 and thus parallel to the main sides of the capacitor body 3.

FIGS. 7A and 7B show that the semiconductor chip 2 has a plurality of emitter units 21. As seen in plan view, the emitter units 21 are arranged, in particular, in the form of a regular, for example, square grid. The emitter units 21 can be electrically controlled independently of each other or can be electrically connected in parallel. The semiconductor chip 2 is, for example, a surface-emitting semiconductor laser with an emission direction perpendicular to main sides of the capacitor body 3. All emitter units 21 are electrically assigned to the common capacitor body 3.

In the example of FIGS. 8A and 8B, several of the semiconductor chips 2 are provided to generate radiation. A separate capacitor body 3 may be present per semiconductor chip 2 as shown in FIG. 8A, or all semiconductor chips 2 can be mounted on a common capacitor body 3 as shown in FIG. 8B.

An arrangement corresponding to FIG. 8A can also be provided with regard to the emitter units 21 of FIGS. 7A and 7B.

FIG. 8B further illustrates that the control unit 4 can be integrated in the carrier 5. In this example, the carrier 5 is based in particular on silicon. The same can be true for all other examples.

FIG. 8A shows a common control unit 4 for all semiconductor chips 2. Alternatively, a separate control unit 4 can be provided for each stack of a semiconductor chip 2 and an associated capacitor body 3.

FIG. 9 shows an electrical circuit that can likewise be present in all other examples. The circuit of FIG. 9 is constructed analogously to the circuit of FIG. 2B, but can also be constructed in the same way as in FIG. 1B.

FIG. 9 shows several of the switching elements 41 electrically connected in parallel. Alternatively or additionally, a plurality of individual capacitors 33 are present that together form the capacitor body 3. The individual capacitors 33 electrically connect in parallel, too.

A current level in the respective electrical supply lines is reduced by these multiply existing switching elements 41 and/or individual capacitors 33. In this way, the inductance can be further reduced, in particular at the electrical connections that are not realized by the direct, planar connection D.

Figure 10:
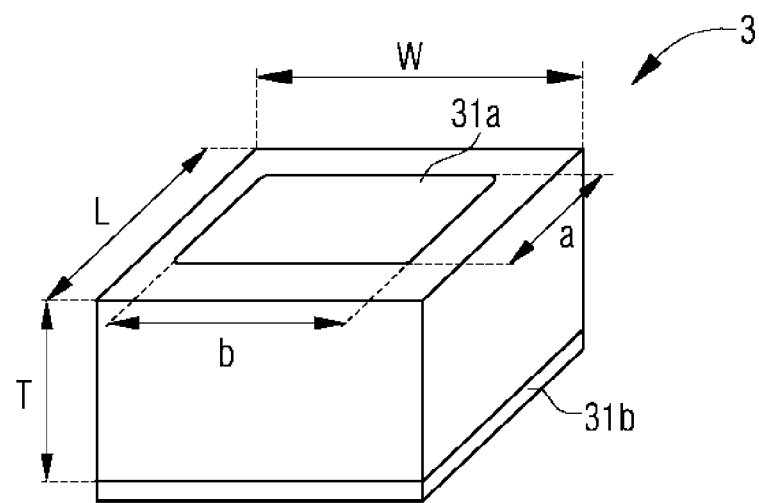
FIG. 10 shows a perspective view of an example of a capacitor body for semiconductor radiation sources.

FIG. 10 shows an example of a capacitor body 3. The capacitor body 3 is based on silicon. A thickness T of the capacitor body 3 lies, for example, at approximately 0.25 mm. A length L and a width W lie in particular in the region of 0.4 mm to 0.8 mm. Electrical contact surfaces $31a$, $31b$ are located on both main sides of the capacitor body 3. On an underside, the electrical contact surface $31b$ can extend completely over the capacitor body 3. On a top side, the contact surface $31a$ has smaller lateral dimensions a, b than the capacitor body 3. In this example, the contact surface $31a$ can be located centrally on the top side of the capacitor body 3. Lengths and widths a, b of the contact surface $31a$ are each, for example, at least 50 μm or 100 μm and/or at most 200 μm or 100 μm smaller than the associated length L and width W of the capacitor body 3.

Other than shown in FIG. 10, the contact surface $31b$ on the underside can also be designed like the contact surface $31a$ as illustrated in FIG. 10 so that the underside is then only partially covered by the contact surface $31b$. It is also possible for the two contact surfaces $31a$, $31b$ to completely cover the associated main sides of the capacitor body 3.

For example, the capacitor body 3 is a silicon chip capacitor of the company IPDiA, in particular from the series WTSC. The capacitance of the capacitor body 3 is, for example, in the range of a few tens of nF.

Figure 11:
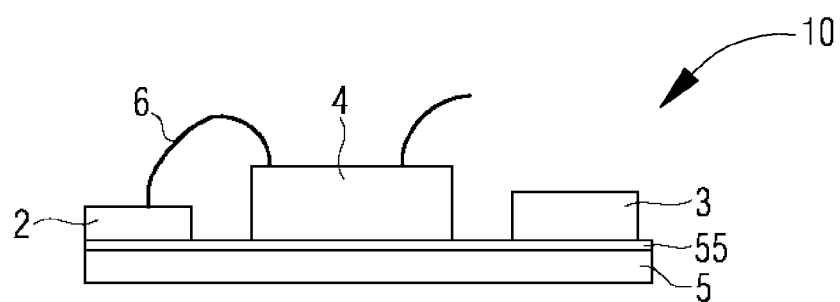
FIG. 11 shows a schematic sectional representation of a modification of a semiconductor radiation source.

FIG. 11 shows a modification 10 of the semiconductor radiation source. In this example, the semiconductor chip 2, the capacitor body 3 and the control unit 4 lie next to one another on the carrier 5. Thus, there are no direct, planar electrical connections between the aforementioned components. Hence, inductance of the electrical supply lines is increased.

Comparing the components of, for example, FIGS. 2A and 2B and 11, a lower total inductance can be achieved with the configuration shown in FIGS. 2A and 2B. It is possible to achieve greater maximum optical powers, smaller pulse widths in the time domain and faster pulse rise times as well as an overall higher efficiency.

For example, in FIGS. 2A and 2B and 11 the inductance of the semiconductor chip 2 is 100 pH or less. The inductance of the switching element 41, in particular a field-effect transistor, is, for example, at most 100 pH or at about 100 pH, too. An inductance of approximately 0.25 nH results from the bond wires 6. In the modification of FIG. 11, because of the capacitor body 3 an inductance of 200 pH to 700 pH and because of the electrical lines via the carrier 5 an inductance of about 0.2 nH or more results.

In contrast thereto, in construction forms as illustrated in connection with FIGS. 2A and 2B, it is possible to achieve an inductance of the capacitor body 3 of approximately 50 pH and of supply lines via the carrier 5 of less than 0.1 nH.

Thus, the modification 10 of FIG. 11 has an overall inductance of approximately 1.2 nH, whereas a total inductance of only approximately 0.5 nH can be achieved in the semiconductor radiation source 1 according to FIGS. 2A and 2B, in particular. The inductance is significantly reduced by the semiconductor radiation source described here.

The components shown in the figures follow, unless indicated otherwise, preferably in the order given in each example directly on top of one another. Layers that are not touching in the figures are arranged at a distance from each other. As far as lines are drawn parallel to one another, the corresponding surfaces are likewise aligned parallel to one another. Likewise, unless indicated otherwise, the relative thickness ratios, relative length rations and the positions of the drawn components in relation to one another are correctly reproduced in the figures.

The semiconductor radiation sources described here are not restricted by the description on the basis of examples. Rather, this disclosure encompasses any new feature and also any combination of features that include in particular any combination of features in the appended claims, even if the feature or combination itself is not explicitly specified in the claims or examples.

This application claims priority of DE 10 2017 108 050.3, the subject matter of which is incorporated herein by reference.

The invention claimed is:

1. A semiconductor radiation source comprising:
   at least one semiconductor chip that generates radiation;
   a controller with one or more switching elements configured for pulsed operation of the semiconductor chip; and
   at least one capacitor body,
   wherein
   the semiconductor chip directly electrically connects in a planar manner to the capacitor body,
   the controller electrically connects to a side of the semiconductor chip opposite the capacitor body, and
   the controller, the capacitor body and the semiconductor chip are stacked on top of each other so that the capacitor body is located between the controller and the semiconductor chip.

2. The semiconductor radiation source according to claim 1,
   wherein the semiconductor chip is a semiconductor laser chip, and
   the capacitor body has a larger base area than the semiconductor chip and an electrical contact area between the semiconductor chip and the capacitor body is at least 50% of the base area.

3. The semiconductor radiation source according to claim 1, wherein the semiconductor chip and the capacitor body have equal lateral dimensions along each direction with a tolerance of at most 10%, and an electrical contact area between the semiconductor chip and the capacitor body is at least 80% of a base surface of the semiconductor chip.

4. The semiconductor radiation source according to claim 1,
   wherein the semiconductor chip and the capacitor body are soldered to each other, and
   a main emission direction of the semiconductor chip is parallel to a base surface of the semiconductor chip and a base surface of the capacitor body.

5. The semiconductor radiation source according to claim 1,
   wherein the semiconductor chip is a ridge waveguide laser,
   a ridge waveguide of the semiconductor chip is arranged on a side of the semiconductor chip facing away from the capacitor body.

6. The semiconductor radiation source according to claim 1, wherein the capacitor body is monolithically designed as a chip and is based on silicon.

7. The semiconductor radiation source according to claim 1, wherein the capacitor body is composed of a plurality of individual capacitors that electrically connect in parallel.

8. The semiconductor radiation source according to claim 1, wherein a direct, planar electrical connection between the semiconductor chip and the capacitor body has an inductance of at most 50 pH.

9. The semiconductor radiation source according to claim 1,
   wherein the capacitor body has a capacity of at least 20 nF,
   the semiconductor radiation source can be surface-mounted, and
   a total thickness of the capacitor body together with the semiconductor chip is at least 0.1 mm and at most 0.5 mm.

10. The semiconductor radiation source according to claim 1, comprising a plurality of the semiconductor chips that are regularly arranged in a two-dimensional array as seen in plan view,
    wherein all the semiconductor chips are arranged together on a single capacitor body.

11. The semiconductor radiation source according to claim 1, comprising a plurality of the capacitor bodies and a plurality of the semiconductor chips regularly arranged in a two-dimensional array as seen in plan view,
    wherein the semiconductor chips are mounted on the capacitor bodies in a one-to-one manner.

12. A semiconductor radiation source comprising:
    at least one semiconductor chip that generates radiation; and
    at least one capacitor body,
    wherein
    the semiconductor chip and the capacitor body are stacked on top of each other, the semiconductor chip directly electrically connects in a planar manner to the capacitor body, and the capacity body is comprised of a plurality of individual capacitators that electrically connect in parallel.

13. The semiconductor radiation source according to claim 12, further comprising a controller having one or more switching elements for pulsed operation of the semiconductor chip, wherein the controller electrically connects to a side of the semiconductor chip opposite the capacitor body.

14. The semiconductor radiation source according to claim 13, wherein the controller and the capacitor body are arranged next to each other on a common carrier.

15. The semiconductor radiation source according to claim 13, wherein the controller, the capacitor body and the semiconductor chip are stacked on top of each other.

16. The semiconductor radiation source according to claim 13, wherein the controller, the capacitor body and the semiconductor chip are stacked on top of each other so that the semiconductor chip is located between the controller and the capacitor body, and the semiconductor chip electrically connects directly to the controller and the capacitor body.

* * * * *